(12) United States Patent
Yasuda et al.

(10) Patent No.: US 11,387,803 B2
(45) Date of Patent: Jul. 12, 2022

(54) COMPOSITE FILTER DEVICE

(71) Applicant: Murata Manufacturing Co., Ltd., Nagaokakyo (JP)

(72) Inventors: Junpei Yasuda, Nagaokakyo (JP); Morio Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/551,771

(22) Filed: Aug. 27, 2019

(65) Prior Publication Data

US 2019/0386634 A1 Dec. 19, 2019

Related U.S. Application Data

(63) Continuation of application No. PCT/JP2018/009476, filed on Mar. 12, 2018.

(30) Foreign Application Priority Data

Mar. 31, 2017 (JP) .............................. JP2017-070565

(51) Int. Cl.
*H03H 9/02* (2006.01)
*H03H 7/075* (2006.01)
(Continued)

(52) U.S. Cl.
CPC .......... *H03H 9/0222* (2013.01); *H03H 7/075* (2013.01); *H03H 7/38* (2013.01);
(Continued)

(58) Field of Classification Search
CPC ...... H03H 9/0222; H03H 9/6483; H03H 9/72; H03H 7/075; H03H 7/38; H03H 7/46
See application file for complete search history.

(56) References Cited

U.S. PATENT DOCUMENTS

| 5,933,062 A * | 8/1999 | Kommrusch ........ H03H 9/6483 310/313 B |
| 2002/0044031 A1 | 4/2002 | Takamine |

(Continued)

FOREIGN PATENT DOCUMENTS

| JP | 06-260876 A | 9/1994 |
| JP | 09-98046 A | 4/1997 |

(Continued)

OTHER PUBLICATIONS

Official Communication issued in International Patent Application No. PCT/JP2018/009476, dated Jun. 5, 2018.
(Continued)

*Primary Examiner* — Samuel S Outten
(74) *Attorney, Agent, or Firm* — Keating & Bennett, LLP

(57) ABSTRACT

A composite filter device includes bandpass filters whose respective one ends are electrically connected in common. A first bandpass filter of the bandpass filters includes a first filter, a switch, a second filter, and an impedance element that is electrically connected to the switch and having an impedance value larger than the input impedance value of the second filter. The switch is configured to be switched between a first state in which the first filter and the second filter are electrically connected and a second state in which the first filter and the impedance element are electrically connected.

20 Claims, 15 Drawing Sheets

(51) Int. Cl.
*H03H 7/38* (2006.01)
*H03H 7/46* (2006.01)
*H03H 9/64* (2006.01)
*H03H 9/72* (2006.01)

(52) U.S. Cl.
CPC ............ *H03H 7/46* (2013.01); *H03H 9/6483* (2013.01); *H03H 9/72* (2013.01)

(56) References Cited

U.S. PATENT DOCUMENTS

| | | |
|---|---|---|
| 2004/0266378 A1 | 12/2004 | Fukamachi et al. |
| 2007/0161357 A1 | 7/2007 | Tudosoiu et al. |
| 2007/0190954 A1 | 8/2007 | Murakami et al. |
| 2012/0182088 A1* | 7/2012 | Inoue .................... H03H 9/725 333/133 |
| 2014/0203887 A1* | 7/2014 | Murata ................. H03H 7/465 333/103 |
| 2015/0028963 A1 | 1/2015 | Ebihara et al. |
| 2015/0372658 A1* | 12/2015 | Zhang ................... H03H 9/568 333/129 |
| 2016/0127115 A1* | 5/2016 | Hayafuji ................ H04B 1/48 370/278 |
| 2017/0272057 A1 | 9/2017 | Takata |
| 2018/0013405 A1 | 1/2018 | Takata |
| 2018/0131344 A1* | 5/2018 | Komatsu ................ H03H 9/605 |

FOREIGN PATENT DOCUMENTS

| | | | |
|---|---|---|---|
| JP | 2002-076838 A | 3/2002 | |
| JP | 2003-273687 A | 9/2003 | |
| JP | 2006-086871 A | 3/2006 | |
| JP | 2009-523340 A | 6/2009 | |
| JP | 2014-033377 A | 2/2014 | |
| JP | 2014-140115 A | 7/2014 | |
| JP | 2015-023557 A | 2/2015 | |
| JP | 2015-029233 A | 2/2015 | |
| WO | 2005/088833 A1 | 9/2005 | |
| WO | WO-2015008557 A1 * | 1/2015 | ............... H04B 1/10 |
| WO | 2016/088680 A1 | 6/2016 | |
| WO | 2016/174938 A1 | 11/2016 | |

OTHER PUBLICATIONS

Official Communication issued in corresponding Japanese Patent Application No. 2020-127845, dated May 18, 2021.
Official Communication issued in corresponding Japanese Patent Application No. 2020-127845, dated Dec. 21, 2021.

* cited by examiner

COMPOSITE FILTER DEVICE

CROSS REFERENCE TO RELATED APPLICATIONS

This application claims the benefit of priority to Japanese Patent Application No. 2017-070565 filed on Mar. 31, 2017 and is a Continuation Application of PCT Application No. PCT/JP2018/009476 filed on Mar. 12, 2018. The entire contents of each application are hereby incorporated herein by reference.

BACKGROUND OF THE INVENTION

1. Field of the Invention

The present invention relates to a composite filter device including a plurality of bandpass filters including respective one ends that are electrically connected in common.

2. Description of the Related Art

Simultaneous use of a plurality of frequency bands has been achieved in, for example, smart phones. Japanese Unexamined Patent Application Publication No. 2015-29233 discloses an example of composite filter devices used in such an application. The composite filter device disclosed in Japanese Unexamined Patent Application Publication No. 2015-29233 includes, in an RF stage, a plurality of bandpass filters corresponding to a plurality of frequency bands. Respective one ends of the bandpass filters are electrically connected in common to an antenna terminal via a multiport ON-SW. The multiport ON-SW includes a plurality of switches used to change the state of connection between the antenna terminal and one of the bandpass filters corresponding to the frequency bands. When the switches are simultaneously brought into the ON state, a plurality of frequencies can be simultaneously used (carrier aggregation).

In the composite filter device disclosed in Japanese Unexamined Patent Application Publication No. 2015-29233, the multiport ON-SW is electrically connected to a stage prior to the bandpass filters. Such a multiport ON-SW has a large circuit size in order to have a switching function and has a large insertion loss in a pass band.

In addition, since the out-of-band reflection coefficient of one of the bandpass filters which is electrically connected to the multiport ON-SW is deteriorated, the insertion loss of another bandpass filter in its pass band which is electrically connected in common with the bandpass filter is increased.

SUMMARY OF THE INVENTION

Preferred embodiments of the present invention provide composite filter devices in each of which the insertion losses of commonly connected bandpass filters in their respective pass bands are able to be effectively reduced.

A composite filter device according to a preferred embodiment of the present invention includes a plurality of bandpass filters having different pass bands. Each of the bandpass filters includes one end and another end. The one ends of the bandpass filters are electrically connected in common. At least one of the bandpass filters includes a switch electrically connected between the one end and the another end, a first filter electrically connected between the one end and the switch, a second filter electrically connected between the switch and the another end, and an impedance element that is electrically connected to the switch and has an impedance value larger than an input impedance value of the second filter. The switch is configured to be switched between a first state in which the first filter and the second filter are electrically connected and a second state in which the first filter and the impedance element are electrically connected.

In a composite filter device according to a preferred embodiment of the present invention, the switch includes a first switch terminal connected to the first filter, a second switch terminal connected to the second filter, and a third switch terminal to which the impedance element is electrically connected. The first switch terminal and the second switch terminal are electrically connected in the first state. The first switch terminal and the third switch terminal are electrically connected in the second state.

In a composite filter device according to a preferred embodiment of the present invention, in the second state, the switch is brought into an OFF state and a value of the impedance element is infinite.

A composite filter device according to a preferred embodiment of the present invention includes a plurality of bandpass filters including respective one ends and the another ends. The one ends of the bandpass filters are electrically connected in common. At least one of the bandpass filters includes a first filter connected to the one end and a second filter electrically connected between the first filter and the another end. Complex impedances of the first filter and the second filter have the same polarity.

In a composite filter device according to a preferred embodiment of the present invention, each of the bandpass filters includes the first filter and the second filter. In a state in which the first filter and the second filter are electrically connected, complex impedances of the first filter and the second filter have the same polarity.

In a composite filter device according to a preferred embodiment of the present invention, at least one of the first filter and the second filter is an elastic wave filter. Both of the first filter and the second filter are preferably elastic wave filters. In this case, the reflection coefficient of another bandpass filter in its pass band which shares a common connection is able to be further increased. Accordingly, the insertion loss of another bandpass filter sharing the common connection is able to be further reduced.

In a composite filter device according to a preferred embodiment of the present invention, the elastic wave filter includes an elastic wave resonator. A range of frequencies higher than or equal to a resonant frequency of the elastic wave resonator and lower than or equal to an anti-resonant frequency of the elastic wave resonator is located in a pass band of another bandpass filter other than the bandpass filter. Accordingly, the insertion loss of another bandpass filter sharing the common connection is able to be further reduced.

In a composite filter device according to a preferred embodiment of the present invention, an out-of-band attenuation of the first filter is larger than an out-of-band attenuation of the second filter. In this case, the relatively large influence of the second filter is able to be effectively reduced. Accordingly, the insertion loss of another bandpass filter sharing the common connection is able to be more effectively reduced.

In a composite filter device according to a preferred embodiment of the present invention, the first filter and the second filter are ladder filters. The number of stages of a ladder in the first filter is smaller than the number of stages of a ladder in the second filter. In this case, the relatively large influence of the second filter is able to be effectively reduced. Accordingly, the insertion loss of another bandpass filter sharing the common connection is able to be more effectively reduced.

In a composite filter device according to a preferred embodiment of the present invention, an impedance matching element is electrically connected between the first filter and the second filter. In this case, the insertion loss of another bandpass filter sharing the common connection is able to be more effectively reduced.

In a composite filter device according to a preferred embodiment of the present invention, the second filter is a longitudinally coupled resonator filter. A longitudinally coupled resonator elastic wave filter may have a sufficiently large attenuation. Accordingly, since the attenuation of the first filter is able to be reduced, the present preferred embodiment is more effective.

In a composite filter device according to a preferred embodiment of the present invention, the second filter is one of a plurality of second filters. The switch includes a plurality of second switch terminals connected to the respective second filters. Thus, the second filter may be provided in plural.

With composite filter devices according to preferred embodiments of the present invention, the insertion loss of another bandpass filter in its pass band which shares a common connection is able to be effectively reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is clarified below through the description of specific preferred embodiments of the present invention with reference to the accompanying drawings.

It is to be noted that the preferred embodiments described in this specification are merely illustrative and the configurations described below may be partially replaced or combined between the different preferred embodiments.

Figure 1:
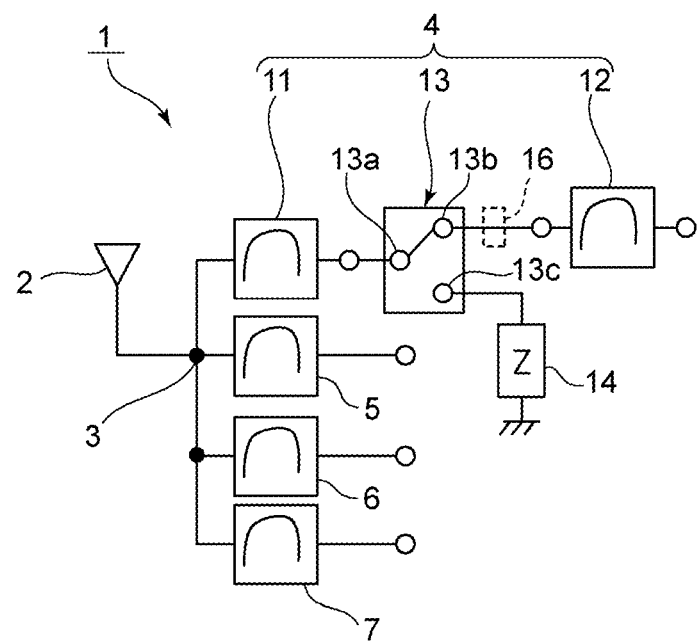
FIG. 1 is a circuit diagram of a composite filter device according to a first preferred embodiment of the present invention.

FIG. 1 is a circuit diagram of a composite filter device according to a first preferred embodiment of the present invention. A composite filter device 1 preferably includes an antenna terminal 3 connected to an antenna 2. A first bandpass filter 4, a second bandpass filter 5, a third bandpass filter 6, and a fourth bandpass filter 7 are electrically connected in common to the antenna terminal 3.

The first bandpass filter 4 is preferably a Band3 reception filter, for example. The pass band of a Band3 reception filter is about 1805 MHz to about 1880 MHz. The second bandpass filter 5 is preferably a Band1 reception filter, for example. The pass band of a Band1 reception filter is about 2110 MHz to about 2170 MHz. The third bandpass filter 6 is preferably a Band40 reception filter, for example. The pass band of a Band40 reception filter is about 2300 MHz to about 2400 MHz. The fourth bandpass filter 7 is preferably a Band7 reception filter, for example. The pass band of a Band7 reception filter is about 2620 MHz to about 2690 MHz.

The respective pass bands of the first bandpass filter 4 to the fourth bandpass filter 7 differ from each other. In preferred embodiments of the present invention, a plurality of bandpass filters having different pass bands are provided. In addition to the bandpass filters having different pass bands, a bandpass filter having a pass band that overlaps the pass band of at least one of the bandpass filters may be further provided.

In preferred embodiments of the present invention, an impedance value represents a characteristic impedance and includes a constant component and a complex component. A characteristic impedance represents a characteristic impedance in the pass bands of a plurality of bandpass filters.

In the composite filter device 1, the first bandpass filter 4 preferably includes a first filter 11, a second filter 12, a switch 13, and an impedance element 14.

One end of the first filter 11 is electrically connected to the antenna terminal 3. The switch 13 preferably includes a first switch terminal 13a, a second switch terminal 13b, and a third switch terminal 13c. The switch 13 is switched between a first state in which the first switch terminal 13a and the second switch terminal 13b are electrically connected to each other and a second state (see FIG. 3) in which the first switch terminal 13a and the third switch terminal 13c are electrically connected to each other.

The output end of the first filter 11 is electrically connected to the first switch terminal 13a. The input end of the second filter 12 is electrically connected to the second switch terminal 13b. The impedance element 14 is electrically connected between the third switch terminal 13c and a ground potential. The impedance value of the impedance element 14 is larger than the input impedance value of the second filter 12. For example, when the input impedance value of the second filter 12 is about 50Ω, the impedance value of the impedance element 14 is greater than 50Ω.

Each of the first bandpass filter 4 to the fourth bandpass filter 7 may preferably be defined by an appropriate filter with which a pass band is able to be provided. The switch 13 may preferably be defined by a transistor, such as an FET, or an appropriate switching element, for example. The impedance element 14 may be an appropriate component with which the above-described impedance value is realized in Band3, Band1, Band40, and Band7.

Figure 2:
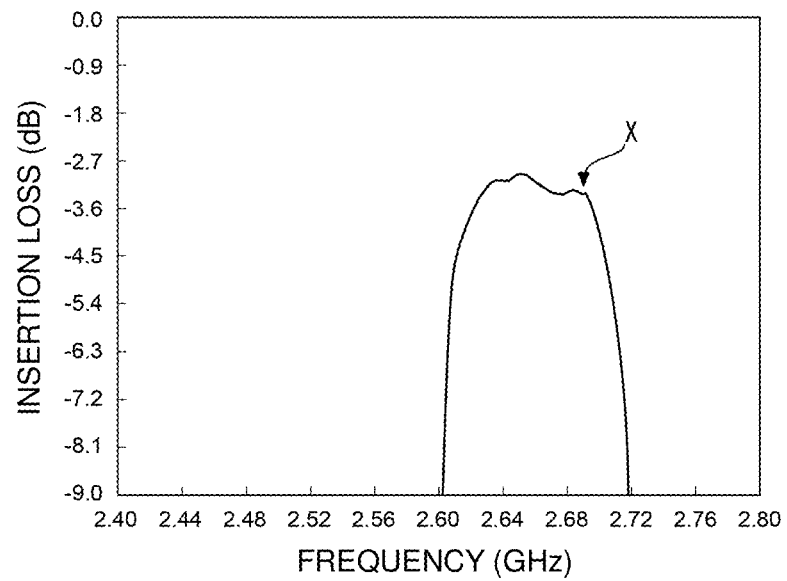
FIG. 2 is a diagram illustrating the filter characteristics of a composite filter device according to the first preferred embodiment of the present invention.

Referring to FIG. 1, the switch 13 is in the first state in which the first filter 11 and the second filter 12 are electrically connected. Band7 filter characteristics in this state are illustrated in FIG. 2. The vertical axes in FIGS. 2, 5, 7, 15, and 22 represent insertion losses. The insertion loss at 2.690 GHz which is represented by arrow X is about −3.294 dB.

Also in FIGS. 6, 7, 15, and 16, arrow X represents the insertion loss at 2.690 GHz.

Figure 3:
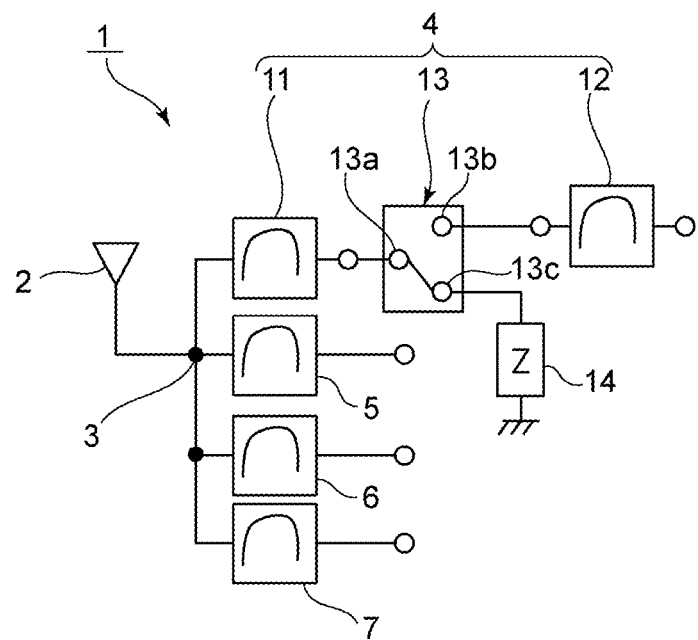
FIG. 3 is a circuit diagram of a composite filter device according to the first preferred embodiment of the present invention when a switch is in a second state.

When Band1 is used and Band3 is not used, the switch 13 is brought into the second state. That is, as illustrated in FIG. 3, the first switch terminal 13a and the third switch terminal 13c are electrically connected in the switch 13. The first filter 11 is therefore electrically isolated from the second filter 12. The impedance element 14 is electrically connected between the first filter 11 and the ground potential. The impedance value of the impedance element 14 is larger than the input impedance value of the second filter 12. Accordingly, the degradation in a reflection coefficient is less likely to occur in the other bandpass filters, the second bandpass filter 5 to the fourth bandpass filter 7. This will be described in detail with reference to FIGS. 5 to 8.

Figure 5:
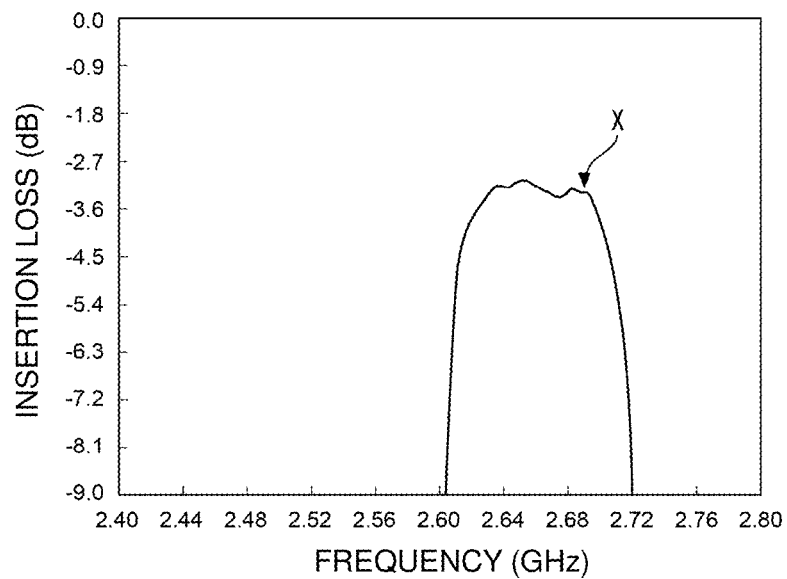
FIG. 5 is a diagram illustrating the filter characteristics of a fourth bandpass filter used in Band7 when the impedance of a connected impedance element is about 50Ω in the first preferred embodiment of the present invention.
Figure 6:
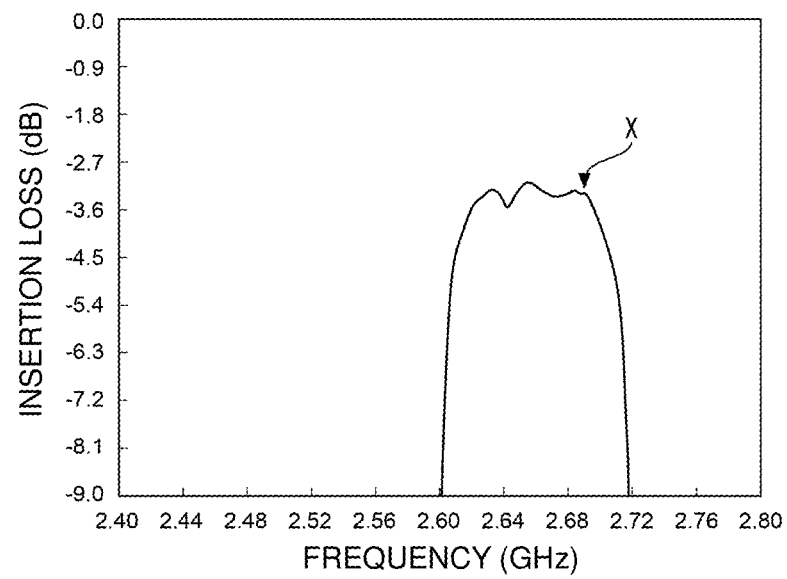
FIG. 6 is a diagram illustrating the filter characteristics of the fourth bandpass filter used in Band7 when the impedance of a connected impedance element is about 1000Ω in the first preferred embodiment of the present invention.
Figure 7:
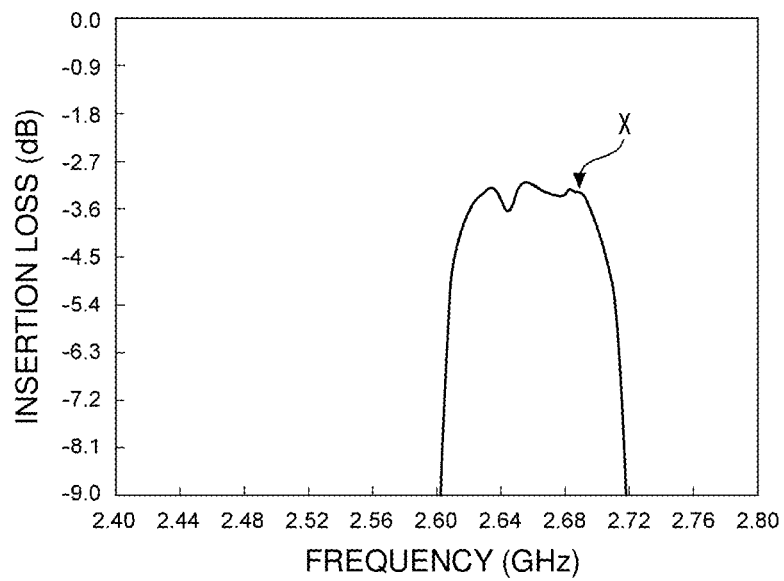
FIG. 7 is a diagram illustrating the filter characteristics of the fourth bandpass filter used in Band7 when a connected impedance element has an infinite impedance, that is, is in an open state in the first preferred embodiment of the present invention.

FIGS. 5, 6, and 7 illustrate the filter characteristics of the fourth bandpass filter 7 in the connection state illustrated in FIG. 3 when the impedance element 14 has the impedance values of about 50Ω, about 1000Ω, or an infinite value, that is, is in an open state, respectively. As illustrated in FIG. 5, when the impedance element 14 has the impedance values of about 50Ω, the insertion loss (dB) at 2.690 GHz is about −3.289 dB. In FIG. 6, the insertion loss (dB) at about 2.690 GHz is about −3.284 dB. In FIG. 7, the insertion loss (dB) at 2.690 GHz is about −3.283 dB. Thus, the increase in the impedance value of the impedance element 14 is able to reduce in the insertion loss of the fourth bandpass filter 7 in the pass band.

Figure 8:
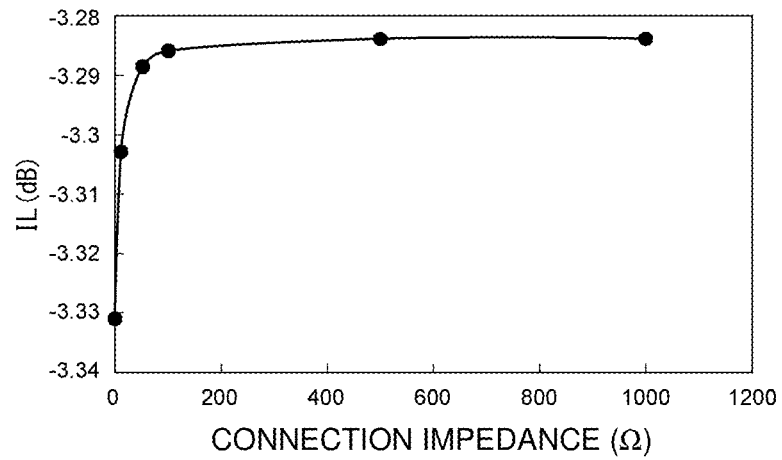
FIG. 8 is a diagram illustrating the relationship between the connection impedance of an impedance element connected to the first bandpass filter and the insertion loss of the fourth bandpass filter used in Band7 at 2.690 GHz in the first preferred embodiment of the present invention.

FIG. 8 is a diagram illustrating the relationship between the connection impedance of the impedance element 14 and the insertion loss (dB) of the fourth bandpass filter 7 at 2.690 GHz. As is apparent from FIG. 8, an insertion loss decreases with the increase in the value of the connection impedance. In particular, when an impedance value is greater than or equal to about 50Ω, the insertion loss can be effectively reduced. More preferably, when the impedance value of the impedance element 14 is greater than or equal to about 100Ω, the insertion loss can be further reduced.

When the impedance value of the impedance element 14 is large, the first switch terminal 13a does not necessarily have to be connected to any switching terminal. That is, in the second state according to the present invention, the switch may be brought into an OFF state in which the first filter 11 and the second filter 12 are not connected. When a switch is in the OFF state, it can be considered for the sake of convenience that an impedance element having an infinite impedance value is electrically connected to the switch.

As described above, by connecting the first switch terminal 13a and the third switch terminal 13c in the switch 13 in the composite filter device 1, the insertion loss of the fourth bandpass filter 7 in its pass band, which is another bandpass filter, is able to be effectively reduced. The reason for this is that the impedance value of the impedance element 14 is larger than the input impedance value of the second filter 12.

Also in the second bandpass filter 5 and the third bandpass filter 6, the degradation in a reflection coefficient in a pass band is able to be reduced or prevented when the impedance element 14 is electrically connected to the first filter 11 in the first bandpass filter 4. Also in the second bandpass filter 5 and the third bandpass filter 6, the insertion loss in the pass band is therefore able to be reduced.

In the present preferred embodiment, the switch 13 is electrically connected between the first filter 11 and the second filter 12 in the first bandpass filter 4 and the impedance element is electrically connected to the third switch terminal 13c. Each of the second bandpass filter 5 to the fourth bandpass filter 7 may have such a configuration. In this case, the reduction in an insertion loss in a pass bands is effectively realized in the second bandpass filter 5, the third bandpass filter 6, and the fourth bandpass filter 7. It is therefore preferable that a switch is electrically connected between the first filter and the second filter and an impedance element is electrically connected between the switch and the ground potential in each of the bandpass filters. It is more preferable that all of the bandpass filters 4 to 7 have the above-described configuration.

The reason why the reduction in an insertion loss is realized in the present preferred embodiment is not only that the insertion losses of the other bandpass filters 5 to 7 is able to be reduced but also that a multiport ON-SW having a large insertion loss is not used. That is, the nonusage of a multiport ON-SW contributes to reduce the insertion losses of the bandpass filters 4 to 7 in the composite filter device 1.

Figure 4:
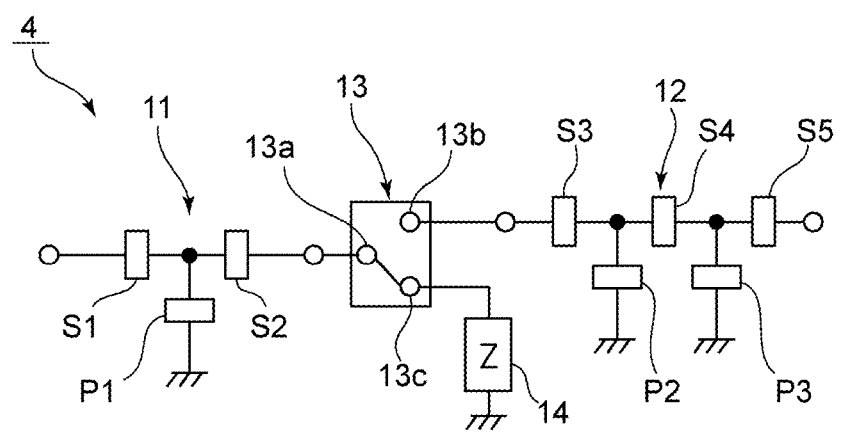
FIG. 4 is a circuit diagram of a first bandpass filter used in the first preferred embodiment of the present invention.

FIG. 4 is a circuit diagram of the first bandpass filter 4. The first filter 11 is a ladder filter including series arm resonators S1 and S2 and a parallel arm resonator P1.

The second filter 12 is a ladder filter including series arm resonators S3, S4, and S5 and parallel arm resonators P2 and P3. Although not particularly limited, the series arm resonators S1, S2, and S3 to S5 and the parallel arm resonators P1, P2, and P3 are preferably elastic wave resonators in the present preferred embodiment.

Both of the first filter 11 and the second filter 12 are therefore preferably elastic wave filters. In preferred embodiments of the present invention, it is preferable that both of the first filter and the second filter are elastic wave filters. In this case, the reflection coefficient of another bandpass filter in a pass band is able to be further increased. The insertion loss of another bandpass filter is therefore able to be further reduced.

More preferably, a range of frequencies that is higher than or equal to the resonant frequency of the above-described elastic wave resonator and lower than or equal to the anti-resonant frequency of the elastic wave resonator is located in the pass band of another bandpass filter. In this case, a significant change occurs at an impedance element in another bandpass filter in the pass band of the bandpass filter. The insertion loss of another bandpass filter is therefore able to be further reduced.

As illustrated in FIG. 4, it is preferable that the number of stages of a ladder in the first filter 11, which is a ladder filter, is smaller than that in the second filter 12, which is a ladder filter. In this case, the change in characteristics at the time of connection and disconnection between the first filter 11 and the second filter 12 becomes larger. The improvement of an insertion loss of another bandpass filter is therefore able to be further effectively realized.

As illustrated in FIG. 1, an impedance matching element represented by a broken line may be electrically connected between the switch 13 and the second filter 12. Thus, between the first filter 11 and the second filter 12, an impedance matching element may be connected.

Figure 9:
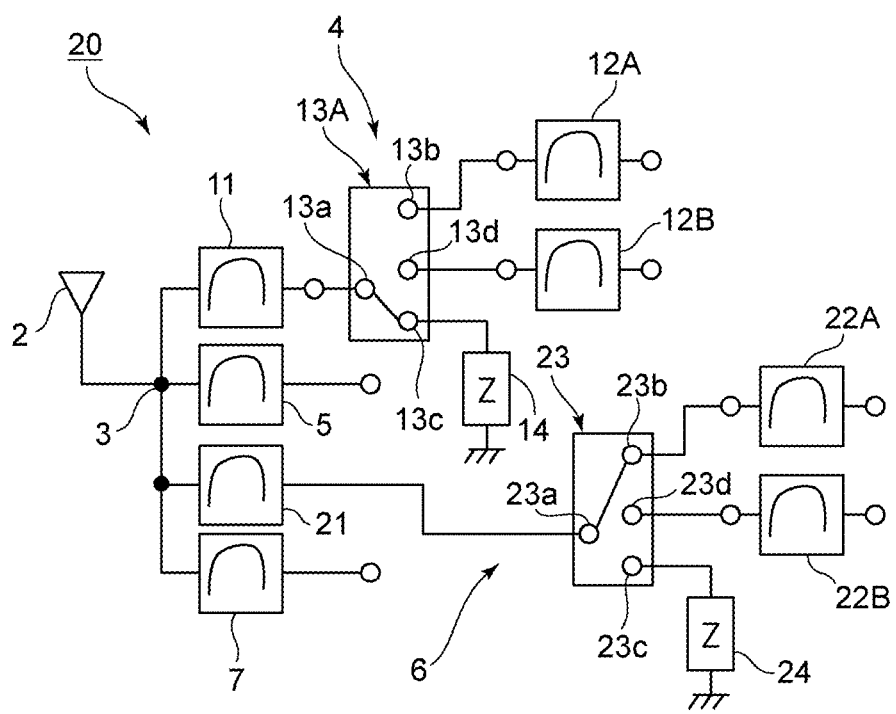
FIG. 9 is a circuit diagram of a composite filter device according to a second preferred embodiment of the present invention.

FIG. 9 is a circuit diagram of a composite filter device according to a second preferred embodiment of the present invention. In a composite filter device 20, the first bandpass filter 4 is preferably used as a Band3 reception filter or a Band25 reception filter, for example. The pass band of the Band25 reception filter is about 1930 MHz to about 1995 MHz. As in the first preferred embodiment, the second bandpass filter 5 is preferably a Band1 reception filter, for example. The third bandpass filter 6 is preferably used as a Band30 reception filter or a Band40 reception filter, for example. The pass band of a Band30 reception filter is about 2350 MHz to about 2360 MHz. As in the first preferred embodiment, the fourth bandpass filter 7 is preferably a Band1 reception filter, for example.

In the composite filter device 20, the first bandpass filter 4 preferably includes a switch 13A and a plurality of second filters 12A and 12B. The switch 13A includes the first switch terminal 13a, the second switch terminal 13b, a second switch terminal 13d, and the third switch terminal 13c. In the switch 13A, the first switch terminal 13a is electrically connected to one of the second switch terminals 13b and 13d and the third switch terminal 13c. The second filter 12A is electrically connected to the second switch terminal 13b. The second filter 12B is electrically connected to the second switch terminal 13d. When the first filter 11 and the second filter 12A are electrically connected, the first bandpass filter 4 functions as a Band3 reception filter. When the first filter 11 and the second filter 12B are electrically connected, the first bandpass filter 4 functions as a Band25 reception filter. The impedance element 14 is electrically connected between the third switch terminal 13c and the ground potential.

The third bandpass filter 6 preferably includes a switch 23 including a first switch terminal 23a, a plurality of second switch terminals 23b and 23d, and a third switch terminal 23c. Second filters 22A and 22B are electrically connected to the second switch terminals 23b and 23d, respectively. Between the third switch terminal 23c and the ground potential, an impedance element 24 is electrically connected.

When a first filter 21 and the second filter 22A are electrically connected, the third bandpass filter 6 defines and functions as a Band40 reception filter. When the first filter 21 and the second filter 22B are electrically connected, the third bandpass filter 6 defines and functions as a Band30 reception filter.

In the present preferred embodiment, the switch 13A in the first bandpass filter 4 is brought into the second state. The connection between the first switch terminal 13a and the third switch terminal 13c can effectively reduce the insertion losses of the other bandpass filters 5 to 7 when neither Band3 nor Band 25 is used. When neither Band40 nor Band30 is used, the switch 23 is brought into the second state in which the first switch terminal 23a and the third switch terminal 23c are electrically connected. Also in this case, the insertion losses of the first bandpass filter 4, the second bandpass filter 5, and the fourth bandpass filter 7 in the respective pass bands are able to be effectively reduced.

Figure 10:
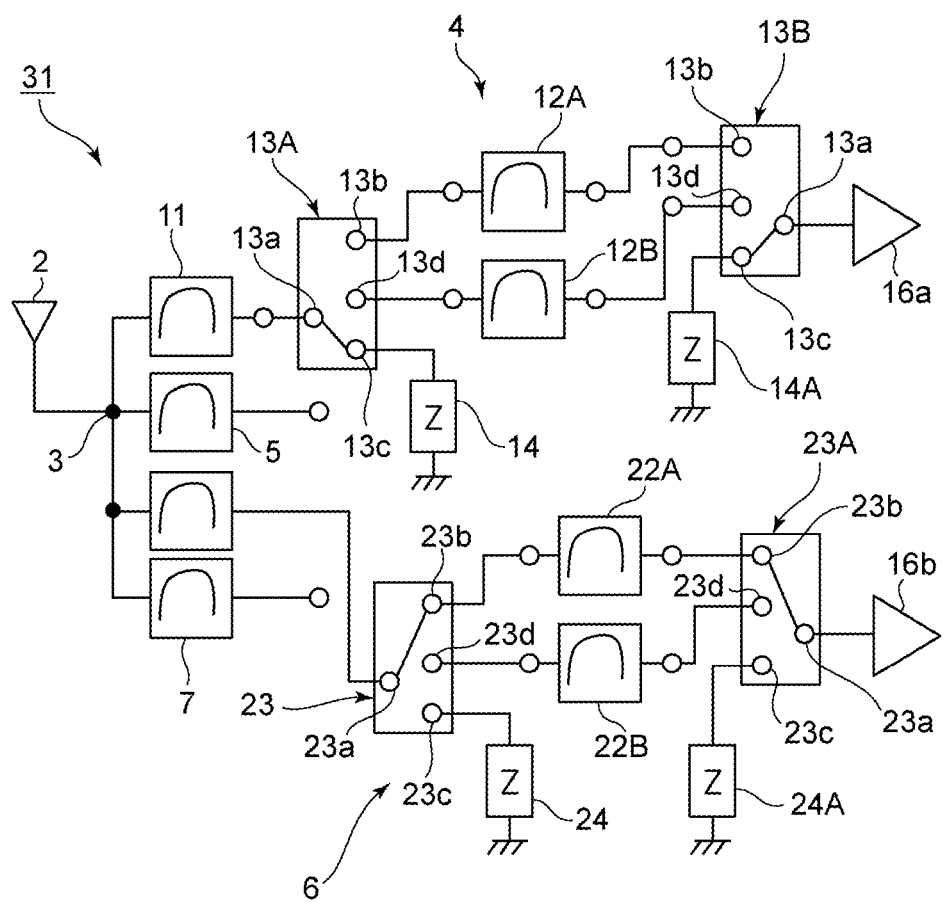
FIG. 10 is a circuit diagram of a composite filter device according to a third preferred embodiment of the present invention.

FIG. 10 is a circuit diagram of a composite filter device according to a third preferred embodiment of the present invention. In a composite filter device 31, a switch 13B, an impedance element 14A, a switch 23A, and an impedance element 24A are provided in addition to the circuit configuration of the composite filter device 20. An amplifier 16a is electrically connected to the first switch terminal 13a of the switch 13B. An amplifier 16b is similarly connected to the first switch terminal 23a of the switch 23A. The remaining configuration of the composite filter device 31 is the same or substantially the same as that of the composite filter device 20.

When neither Band3 nor Band25 is used in the composite filter device 31, the switch 13A is brought into the second state in which the first switch terminal 13a and the third switch terminal 13c are electrically connected. It is preferable that, in the switch 13B, the first switch terminal 13a located on the output side and the third switch terminal 13c is connected. That is, it is preferable that the impedance element 14A is electrically connected between the switch and the ground potential on the output side. Similarly, when Band30 is not used and Band40 is used in the third bandpass filter 6, the first switch terminal 23a and the second switch terminal 23b are electrically connected in the switch 23A. When neither Band30 nor Band40 is used, it is similarly preferable that the first switch terminal 23a and the third switch terminal 23c is connected.

Figure 11:
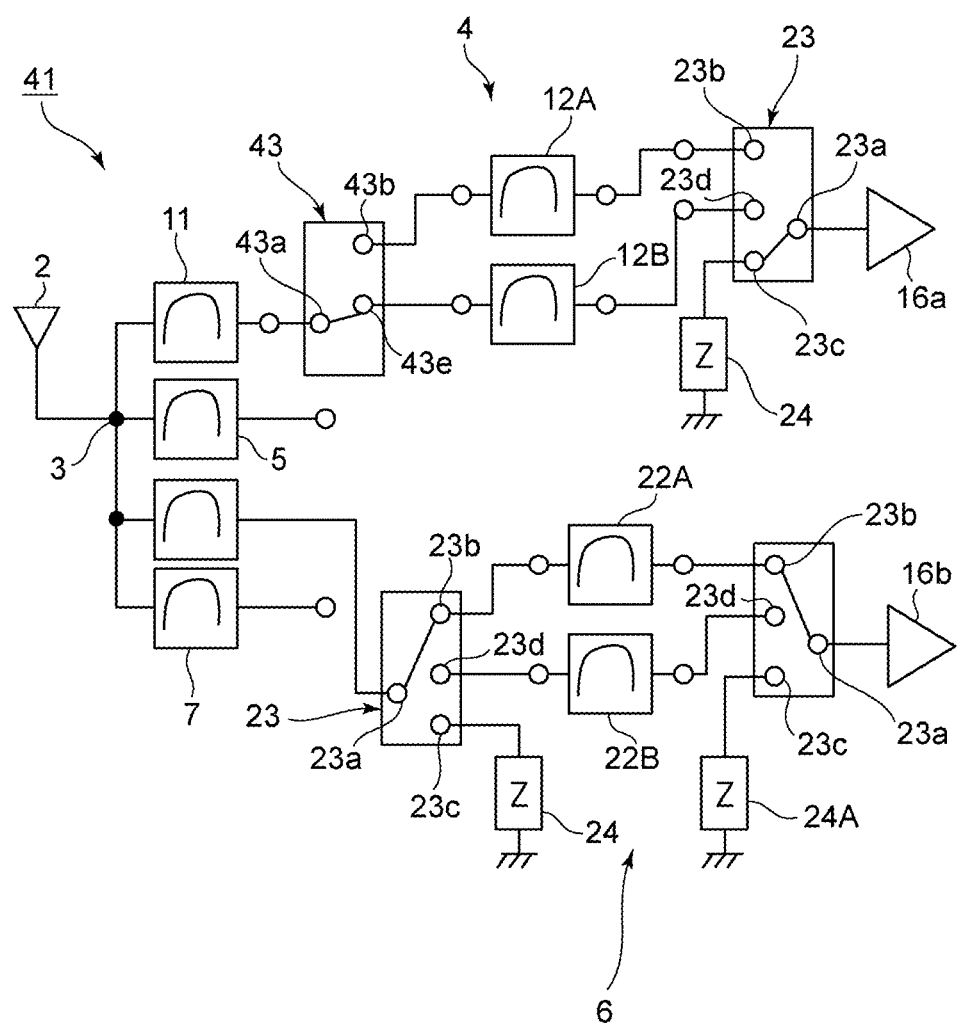
FIG. 11 is a circuit diagram of a composite filter device according to a fourth preferred embodiment of the present invention.

FIG. 11 is a circuit diagram of a composite filter device according to a fourth preferred embodiment of the present invention. A composite filter device 41 preferably includes the second bandpass filter 5 to the fourth bandpass filter 7 included in the composite filter device 31. The composite filter device 41 differs from the composite filter device 31 in the structure of the first bandpass filter 4. In the first bandpass filter 4, the first filter 11 is electrically connected to a first switch terminal 43a of a switch 43. The second filter 12A that is a Band3 reception filter is electrically connected to a switch terminal 43b of the switch 43. The second filter 12B that is a Band25 reception filter is electrically connected to a switch terminal 43e. The switch terminal 43e defines and functions as a second switch terminal and a third switch terminal in the present invention.

An impedance element between the switch terminal 43e and the second switch terminal 23d is preferably set to have the impedance of about 50Ω or greater.

In the second state illustrated in FIG. 11, the first switch terminal 43a and the switch terminal 43b are not connected. Accordingly, Band3 is not used. In the switch 23, the first switch terminal 23a and the second switch terminal 23d are not connected. Accordingly, Band25 is not used even through the second filter 12B is electrically connected to the first filter 11. However, the impedance element between the switch terminal 43e and the second switch terminal 23d has the impedance of about 50Ω or greater. Accordingly, as in the first to third preferred embodiments, the impedance element having the impedance of about 50Ω or greater is electrically connected to the output side of the first filter 11. Also in the composite filter device 41, the insertion losses of the second bandpass filter 5 to the fourth bandpass filter 7 in the respective pass bands are able to therefore be effectively reduced.

The impedance element connected to the output side of the first filter in the present preferred embodiment does not necessarily have to be connected to the ground potential.

Figure 12:
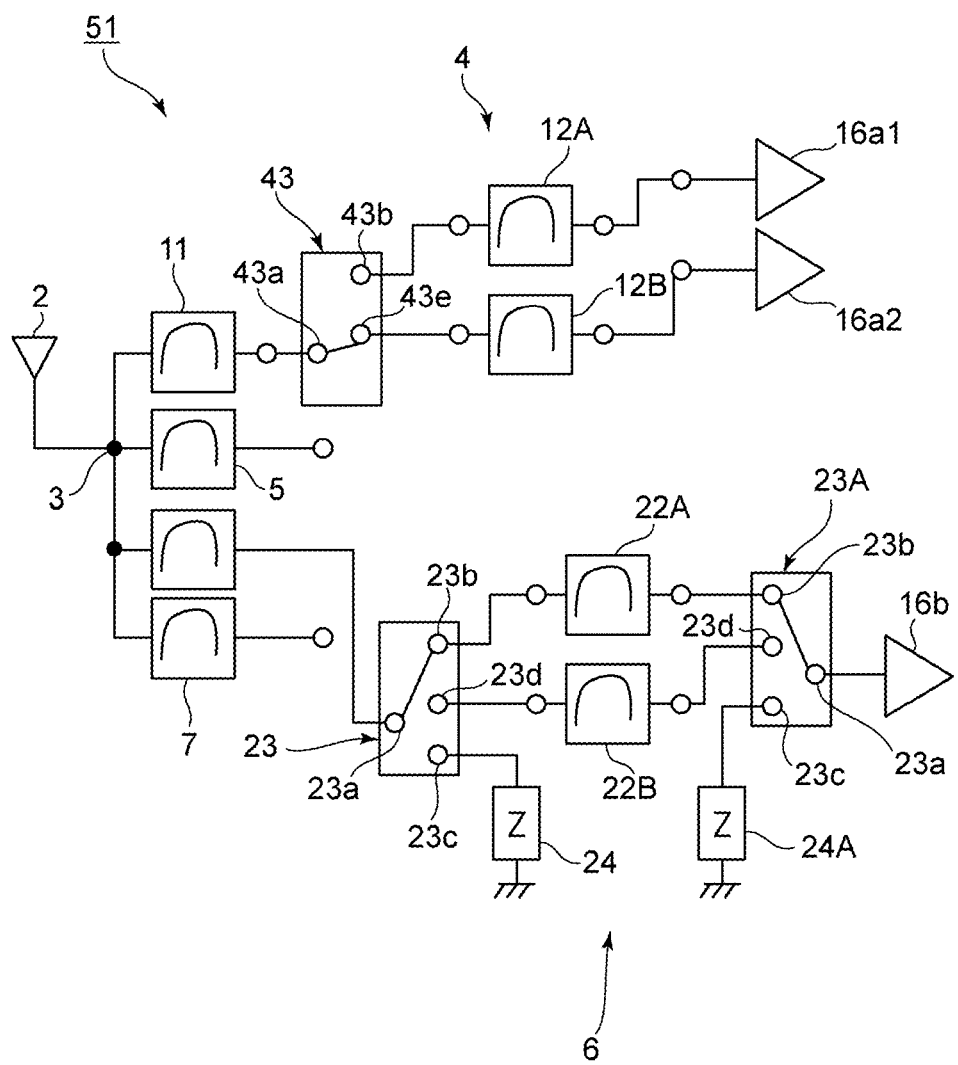
FIG. 12 is a circuit diagram of a composite filter device according to a fifth preferred embodiment of the present invention.

FIG. 12 is a circuit diagram of a composite filter device according to a fifth preferred embodiment of the present invention. In a composite filter device 51, preferably no switch is provided on the output side of the second filters 12A and 12B. A first amplifier 16a1 and a second amplifier 16a2 are preferably electrically connected to the second filters 12A and 12B, respectively. The remaining configuration of the composite filter device 51 is preferably the same or substantially the same as that of the composite filter device 41. Also in the connection state illustrated in FIG. 12, Band3, Band25, and Band30 are not used.

The second filter 12B for Band25 is electrically connected to the first filter 11. By bringing the second amplifier 16a2 into the OFF state, an impedance element having the impedance of about 50Ω or greater is preferably connected to the output side of the first filter 11, as in the composite filter device 41, even though the second filter 12B is electrically connected to the first filter 11. Accordingly, also in the composite filter device 51, the insertion losses of the second bandpass filter 5 to the fourth bandpass filter 7 are able to be reduced.

Figure 13:
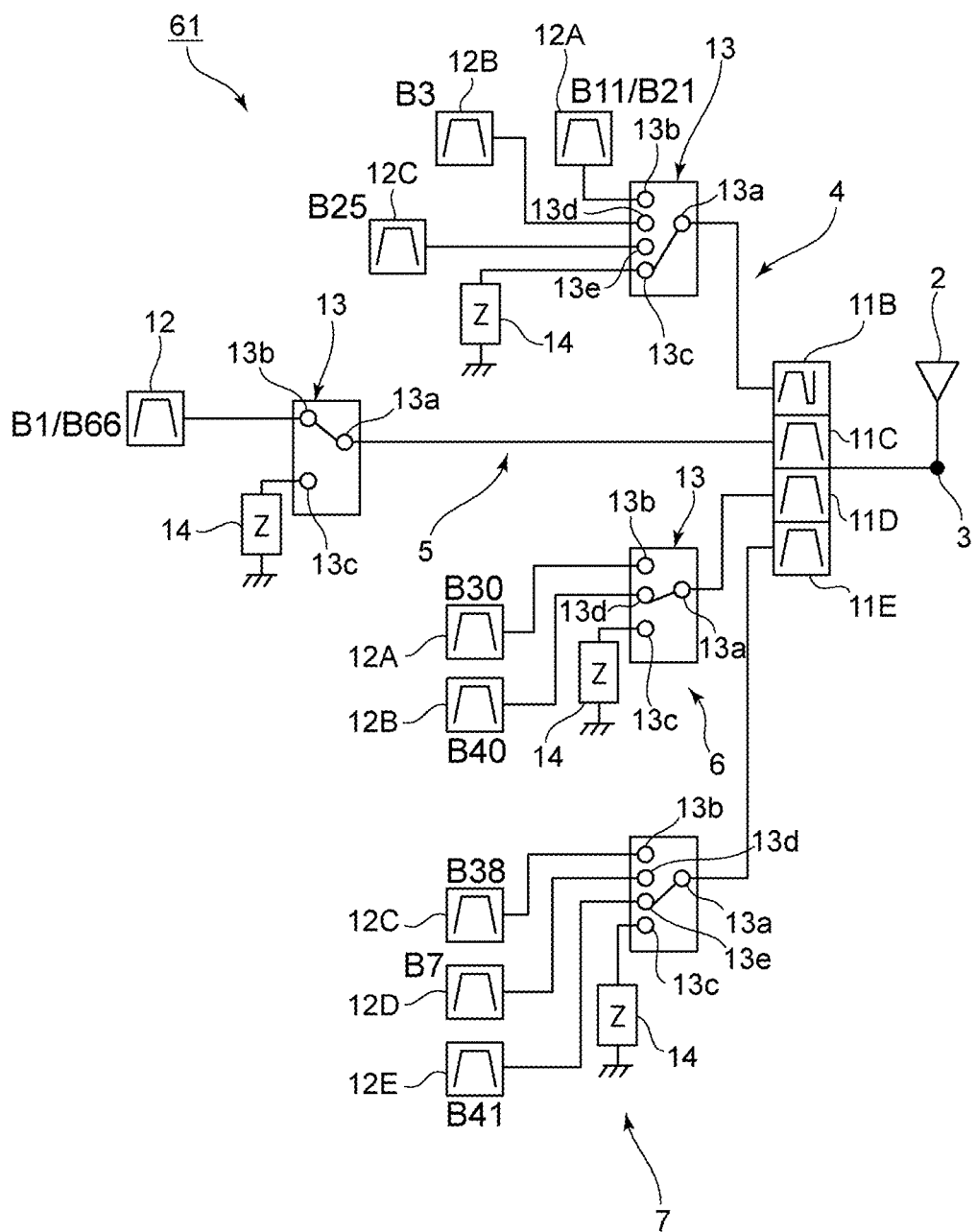
FIG. 13 is a circuit diagram of a composite filter device according to a sixth preferred embodiment of the present invention.

FIG. 13 is a circuit diagram of a composite filter device according to a sixth preferred embodiment of the present invention. In a composite filter device 61, the first bandpass filter 4 to the fourth bandpass filter 7 are preferably electrically connected to the antenna terminal 3. Each of first filters 11B to 11E is a notch filter. The first bandpass filter 4 is a reception filter for Band11, Band21, Band3, and Band25. Referring to FIG. 13, for example, B11 represents Band11.

In the first bandpass filter 4, the switch 13 preferably includes the first switch terminal 13a, the second switch terminals 13b and 13d, a second switch terminal 13e, and the third switch terminal 13c. The second filters 12A and 12B and a second filter 12C are electrically connected to the second switch terminals 13b, 13d, and 13e, respectively. The second filter 12A can be used as a reception filter for both of Band11 and Band21. The pass band of the Band11 reception filter is about 1475.9 MHz to about 1495.9 MHz. The pass band of the Band21 reception filter is about 1495.9 MHz to about 1510.9 MHz. The number of the second filters connected to a switch in a single bandpass filter may be three or more. The second filter may be a filter that is able to be used in a plurality of Bands.

In the fourth bandpass filter 7, second filters 12C, 12D, and 12E are electrically connected to the second switch terminals 13b, 13d, and 13e, respectively.

As described above, the first filters 11B to 11E do not necessarily have to be bandpass filters. That is, a pass band may be defined by the first filter and the second filter.

Each of the symbols at the second filters in the second bandpass filter 5 to the fourth bandpass filter 7, such as B1, similarly indicates that the second filter is a Band1 reception filter.

Figure 14:
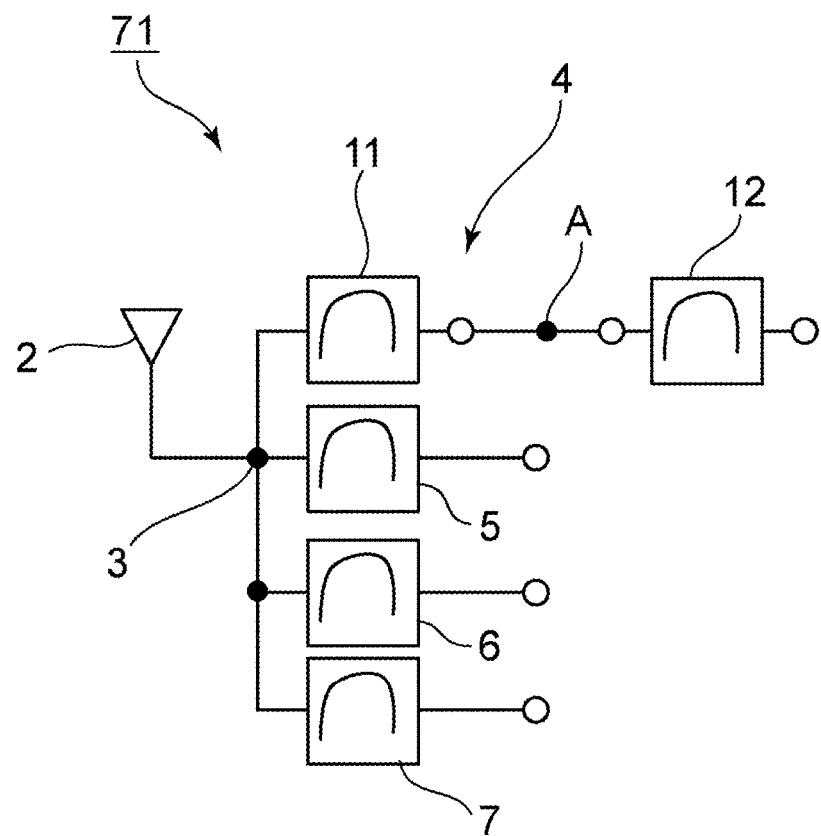
FIG. 14 is a circuit diagram of a composite filter device according to a seventh preferred embodiment of the present invention.

FIG. 14 is a circuit diagram of a composite filter device according to a seventh preferred embodiment of the present invention. A composite filter device 71 includes the antenna terminal 3 connected to the antenna 2. Respective one ends of the first bandpass filter 4 to the fourth bandpass filter 7 are electrically connected in common to the antenna terminal 3. The first bandpass filter 4 includes the first filter 11 and the second filter 12 connected to a stage subsequent to the first filter 11. Like the first bandpass filter 4 to the fourth bandpass filter 7 in the composite filter device 1 according to the first preferred embodiment, the first bandpass filter 4 to the fourth bandpass filter 7 are preferably a Band3 reception filter, a Band1 reception filter, a Band40 reception filter, and a Band1 reception filter, respectively, for example.

The second bandpass filter 5 to the fourth bandpass filter 7 are preferably the same or substantially the same as the second bandpass filter 5 to the fourth bandpass filter 7 in the first preferred embodiment, respectively. The feature of the present preferred embodiment is that, in the impedance characteristics of the first filter 11 and the second filter 12 in the first bandpass filter 4 which are viewed from the same point in a circuit, reactive components in complex impedances have the same polarity sign in the pass band of the fourth bandpass filter 7. The polarity of the reactive component in the complex impedance can be checked in a Smith chart in which impedances measured by a network analyzer are plotted.

The impedance characteristics of the first filter 11 and the second filter 12 viewed from the same point in a circuit are, for example, the impedance characteristics of the first filter 11 viewed from point A in FIG. 14 and the impedance characteristics of the second filter 12 viewed from the point A. The point A may be any point between the first filter 11 and the second filter 12.

In the present preferred embodiment, the complex impedances of the first filter 11 and the second filter 12 have the same polarity sign at 2.620 GHz. This sufficiently reduces an insertion loss in the pass band of the fourth bandpass filter 7 that is a Band7 reception filter. This will be described with reference to FIGS. 15 to 18 and FIGS. 19 and 22 illustrating a comparative example.

Figure 16:
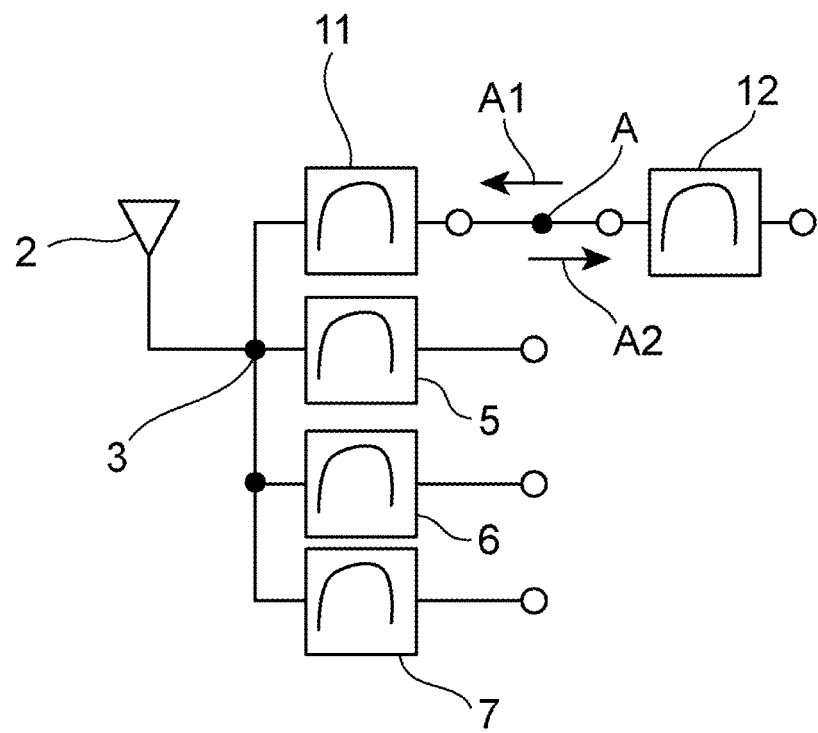
FIG. 16 is a schematic diagram describing a state where a first filter and a second filter in a first bandpass filter in a composite filter device according to the seventh preferred embodiment are electrically connected or electrically isolated.
Figure 17:
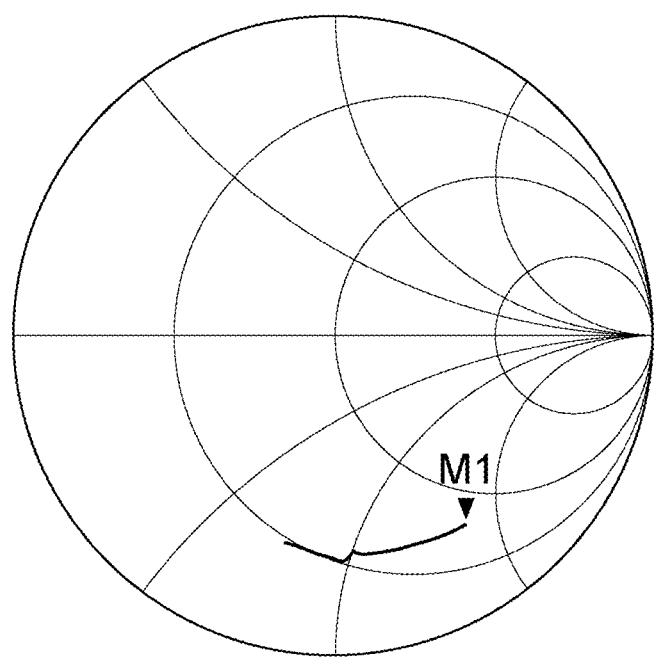
FIG. 17 is an impedance Smith chart illustrating the impedance characteristics of the first filter when the second filter is electrically connected to the first filter in the first bandpass filter in the seventh preferred embodiment of the present invention.
Figure 18:
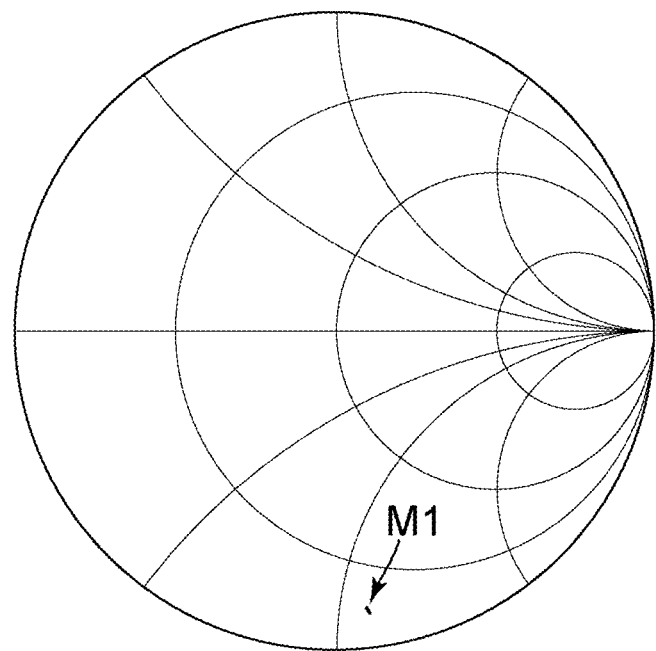
FIG. 18 is an impedance Smith chart illustrating the impedance characteristics of the second filter when the second filter is electrically connected to the first filter in the first bandpass filter in the seventh preferred embodiment of the present invention.

FIG. 17 is an impedance Smith chart illustrating the impedance characteristics of the first filter viewed from the point A in a direction represented by arrow A1 in FIG. 16. FIG. 18 is an impedance Smith chart illustrating the impedance characteristics of the second filter 12 viewed from the point A as represented by arrow A2 in FIG. 16. In both cases, the complex impedances at the 2.620 GHz represented by point M1 in FIGS. 17 and 18 have the same negative polarity sign.

Figure 15:
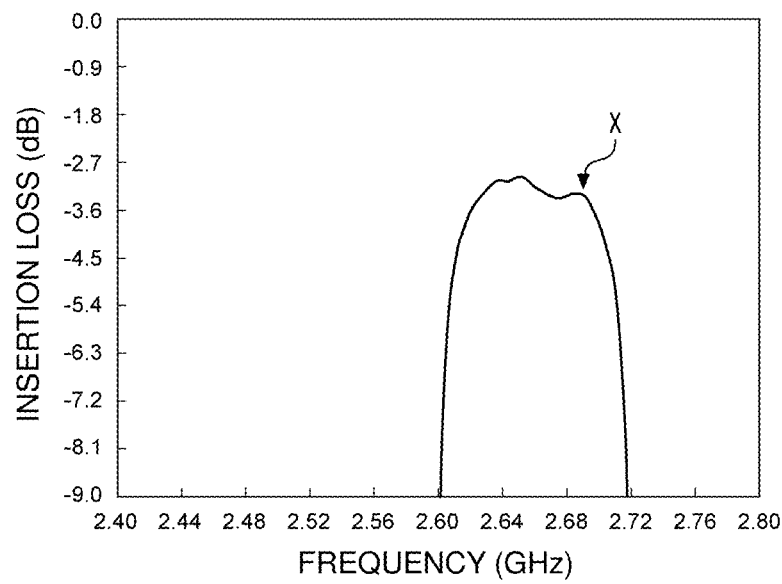
FIG. 15 is a diagram illustrating the filter characteristics of a fourth bandpass filter used in Band7 in a composite filter device according to the seventh preferred embodiment of the present invention.

The filter characteristics of the fourth bandpass filter 7 that is a Band7 reception filter are illustrated in FIG. 15. As illustrated in FIG. 15, an insertion loss (dB) is about −3.579 dB at 2.620 GHz in the pass band and is about −3.284 dB at 2.690 GHz.

Figure 19:
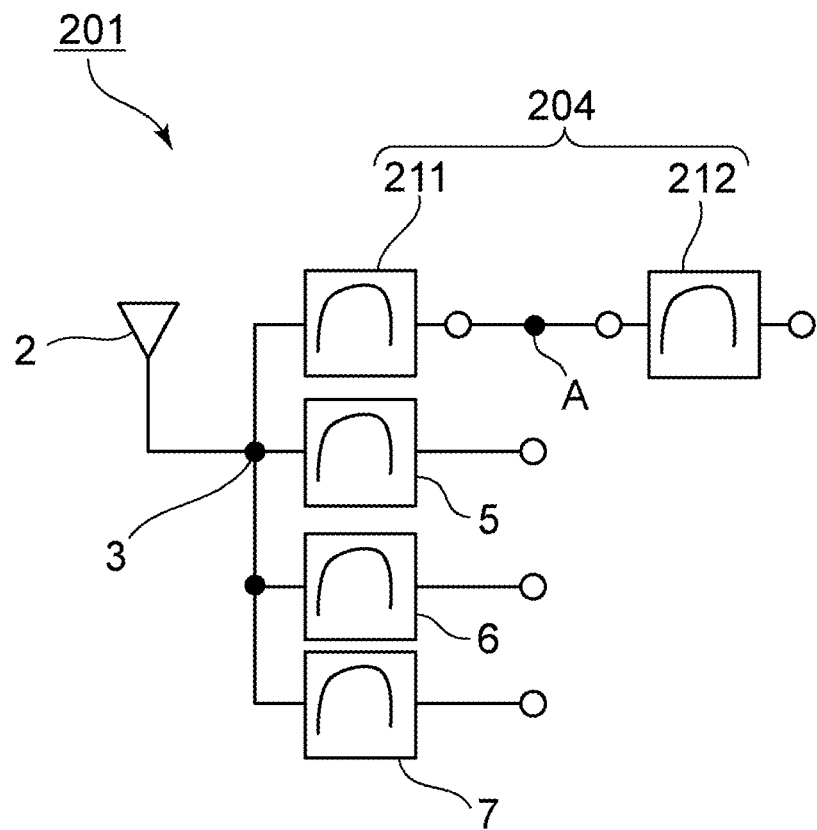
FIG. 19 is a circuit diagram of a composite filter device that is a comparative example.
Figure 20:
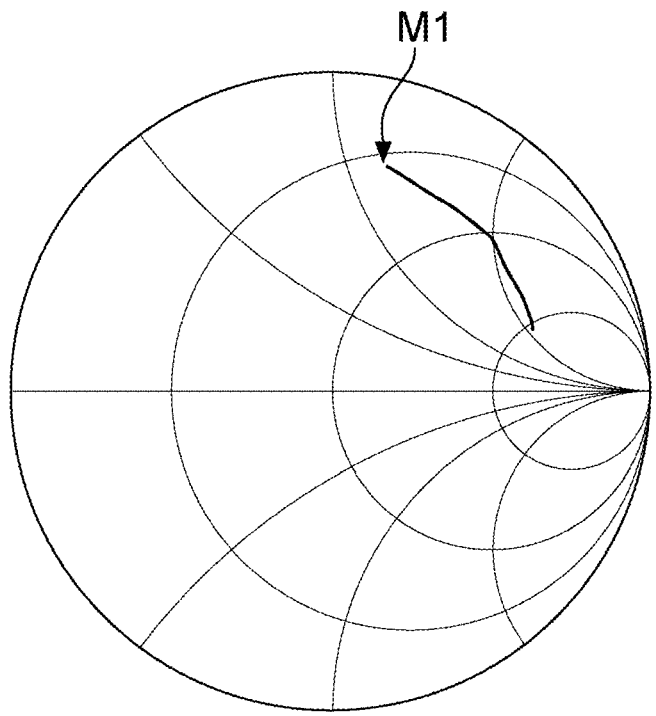
FIG. 20 is an impedance Smith chart illustrating impedance characteristics on the side of a first filter when the first filter and a second filter in a first bandpass filter are electrically isolated in the composite filter device that is the comparative example illustrated in FIG. 19.
Figure 21:
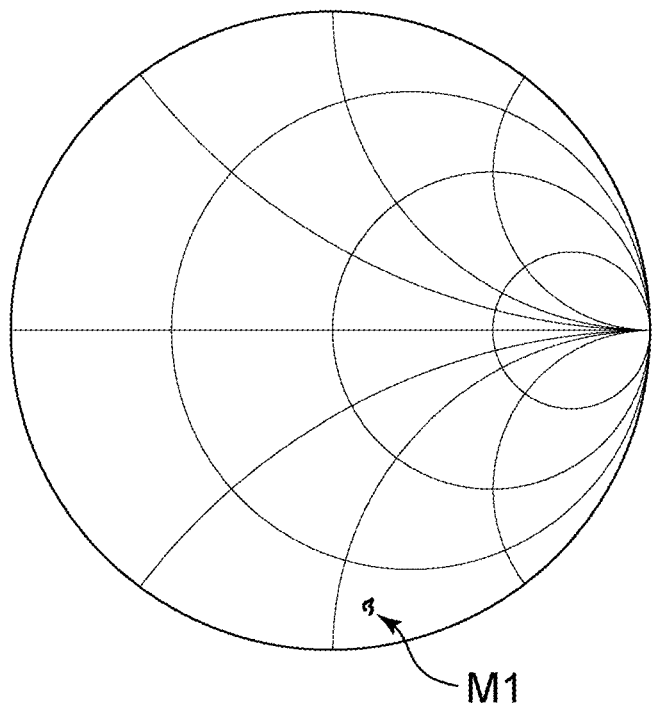
FIG. 21 is an impedance Smith chart illustrating impedance characteristics on the side of the second filter when the first filter and the second filter in the first bandpass filter are electrically isolated in the composite filter device that is the comparative example illustrated in FIG. 19.

FIG. 19 is a circuit diagram of a composite filter device 201 that is a comparative example. In the composite filter device 201 that is a comparative example, a first bandpass filter 204 includes a first filter 211 and a second filter 212. The impedance characteristics of the first filter 211 viewed from point A are illustrated by an impedance Smith chart in FIG. 20. The impedance characteristics of the second filter 212 viewed from the point A are illustrated by an impedance Smith chart in FIG. 21. As is apparent from FIGS. 20 and 21, the reactive component in the complex impedance at 2.620 GHz represented by point M1 has a negative (capacitive) polarity in the second filter 212, while the reactive component in the complex impedance at 2.620 GHz represented by point M1 has a positive (inductive) polarity in the first filter 211. That is, the complex impedances are in a complex conjugate relationship. Note that the expression that the complex impedances of two circuits are in a complex conjugate relationship includes a relationship in which the positive and negative complex components of each of the complex impedances are reversed, and is not limited to a case in which the absolute values of the complex components are equal. That is, the complex conjugate relationship in the present preferred embodiment also includes cases in which the complex impedance of one of the circuits is located at a capacitive area (the lower semicircle of the Smith chart) and the complex impedance of the other circuit is located at an inductive area (the upper semicircle of the Smith chart).

The configuration of the composite filter device 201 that is a comparative example is the same or substantially the same as that of the composite filter device 71 except for the above-described polarities of the complex impedances.

Figure 22:
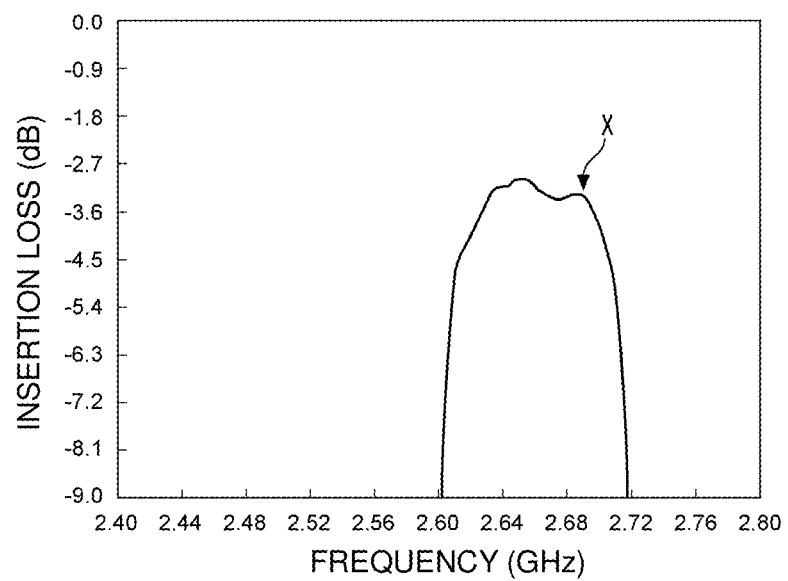
FIG. 22 is a diagram illustrating the filter characteristics of a fourth bandpass filter used in Band1 in a composite filter device that is a comparative example.

FIG. 22 is a diagram illustrating the filter characteristics of the fourth bandpass filter 7 in a composite filter device that is a comparative example. Referring to FIG. 22, an insertion loss (dB) is about −3.942 dB at 2.620 GHz in the pass band and is about −3.287 dB at 2.690 GHz.

As is apparent from the comparison between the results illustrated in FIGS. 22 and 15, an insertion loss in the pass band of the fourth bandpass filter is able to be effectively reduced in the seventh preferred embodiment as compared with in the comparative example.

The composite filter device 71 according to the seventh preferred embodiment corresponds to a preferred embodiment of a second invention in this application. By making complex impedances have the same polarity sign in the impedance characteristics of the first and second filters viewed from the same point in the circuit, the insertion loss of another bandpass filter, the fourth bandpass filter 7, is able to be reduced. The reason for this is that the value of an impedance element in the second filter 12 is able to be increased because of the complex impedances having the same polarity. In the composite filter device 201 that is a comparative example in which the respective complex impedances of the first filter 211 and the second filter 212 have opposite polarity signs, the insertion loss of the fourth bandpass filter is large. The reason for this is that an impedance element having a low impedance is provided between the first and second filters in the comparative example. A signal of a frequency that should flow through the fourth bandpass filter 7 enters its own filter, that is, the first bandpass filter 4.

As described above, also in the composite filter device 71 according to the seventh preferred embodiment, the insertion losses of the other bandpass filters 5 to 7 sharing the common connection are able to be effectively reduced. Also in the composite filter device 71 according to the seventh preferred embodiment, it is preferable that both of the first and second filters are elastic wave filters as in the composite filter device 1 according to the first preferred embodiment. In this case, the insertion losses of the other bandpass filters 5 to 7 in their respective pass bands are able to be further reduced. Also in the composite filter device 71, preferred embodiments of the present invention are effective when an elastic wave filter includes an elastic wave resonator and a range of frequencies higher than or equal to the resonant frequency of the elastic wave resonator and lower than or equal to the anti-resonant frequency of the elastic wave resonator is located in the pass bands of the bandpass filters 5 to 7 other than the first bandpass filter 4.

Also in the composite filter device 71, it is preferable that the attenuation out of the pass band of the first filter 11 (in the pass bands of the other bandpass filter 5 to 7) is larger than the attenuation out of the pass band of the second filter 12 (in the pass bands of the other bandpass filter 5 to 7). When the first filter 11 and the second filter 12 are ladder filters, it is similarly preferable that the number of stages of a ladder in the first filter 11 is smaller than that in the second filter 12.

Also in the composite filter device 71, it is preferable that an impedance matching element is electrically connected between the first filter 11 and the second filter 12.

Also in the composite filter device 71, the second filter 12 may be provided in plural. In this case, it is preferable that a switch connecting the first filter 11 to the second filters 12 be provided.

Figure 23:
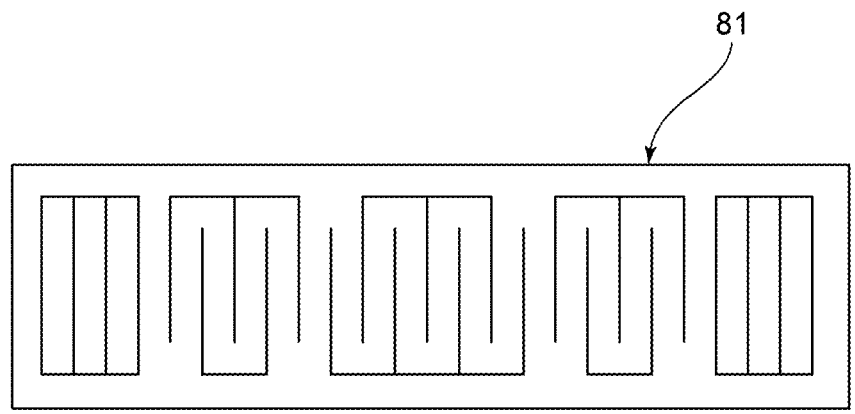
FIG. 23 is a plan view of a longitudinally coupled resonator elastic wave filter which illustrates the electrode structure of the longitudinally coupled resonator elastic wave filter.

Although a ladder filter is preferably used as an elastic wave filter in the above-described preferred embodiments, a longitudinally coupled resonator filter 81, as illustrated in FIG. 23, may alternatively be used as the second filter if so desired. When the longitudinally coupled resonator filter 81 is used, a large attenuation is able to be easily realized. Accordingly, the present invention is effective when the second filter includes a longitudinally coupled resonator filter.

Figure 24:
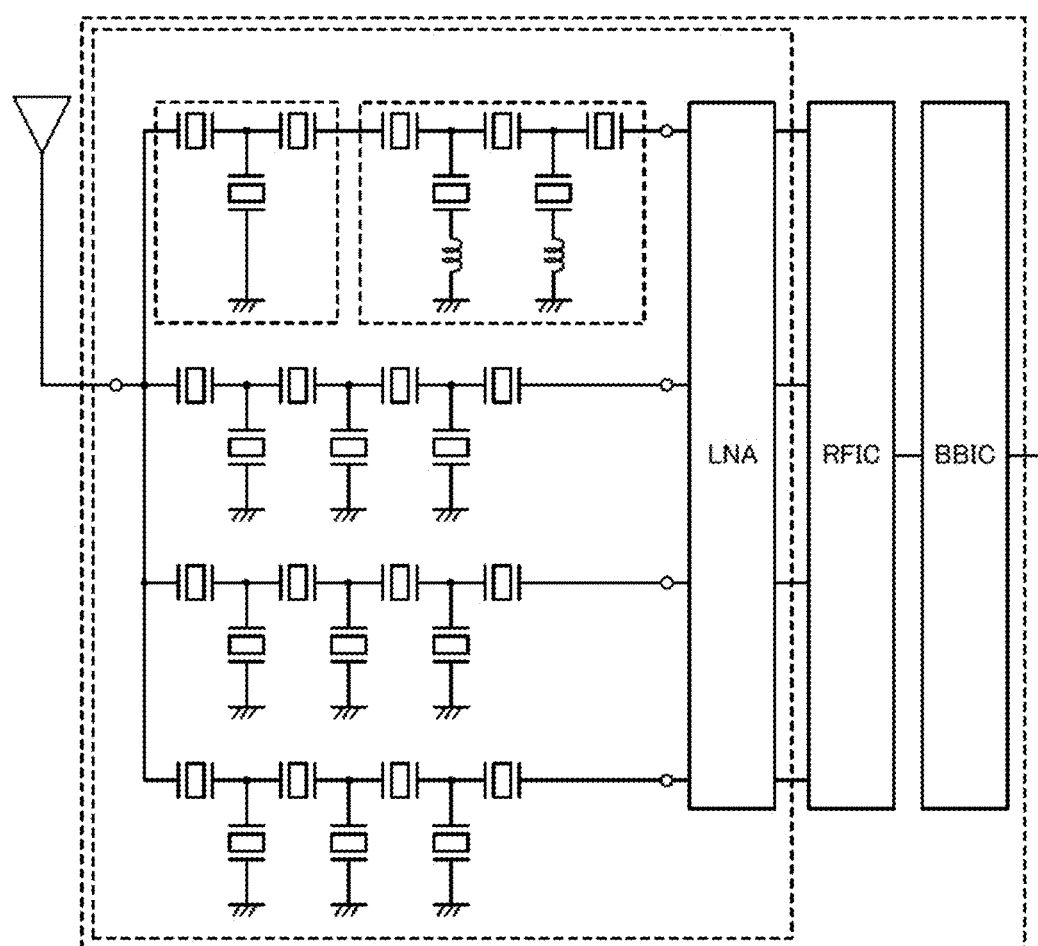
FIG. 24 is a circuit diagram of a high-frequency front end circuit and communication device including a composite filter device according to a preferred embodiment of the present invention.

FIG. 24 is a circuit configuration diagram of a high-frequency front end circuit 100 and a communication device 200 including a composite filter device according to the above-described preferred embodiments of the present invention will be described. FIG. 24 shows the high-frequency front end circuit 100, an antenna element 150, an amplification circuit (LNA) 160, an RF signal processing circuit (RFIC) 170, and a baseband signal processing circuit (BBIC) 180. The high-frequency front end circuit 100, the RF signal processing circuit 170, and the baseband signal processing circuit 180 define the communication device 200.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device, comprising:
bandpass filters having different pass bands; wherein
each of the bandpass filters includes one end and another end;
the one ends of the bandpass filters are electrically connected in common;
at least one of the bandpass filters includes a switch electrically connected between the one end and the another end, a first bandpass filter electrically connected between the one end and the switch, a second bandpass filter electrically connected between the switch and the another end, and an impedance element electrically connected to the switch and having an impedance value larger than an input impedance value of the second bandpass filter; and
the switch is configured to be switched between a first state in which the first bandpass filter and the second bandpass filter are electrically connected and a second state in which the first bandpass filter and the impedance element are electrically connected.

2. The composite filter device according to claim 1, wherein at least one of the first bandpass filter and the second bandpass filter is an elastic wave filter.

3. The composite filter device according to claim 2, wherein the first bandpass filter and the second bandpass filter are elastic wave filters.

4. The composite filter device according to claim 2, wherein
the elastic wave filter includes an elastic wave resonator; and
a range of frequencies higher than or equal to a resonant frequency of the elastic wave resonator and lower than or equal to an anti-resonant frequency of the elastic wave resonator is located in a pass band of another of the bandpass filters other than the at least one of the bandpass filters.

5. The composite filter device according to claim 2, wherein the second bandpass filter is a longitudinally coupled resonator filter.

6. A high-frequency front end circuit device, comprising:
the composite filter device according to claim 1; and
an amplification circuit electrically connected to the composite filter device.

7. A communication device comprising:
the high-frequency front end circuit device according to claim 6;
an RF signal processing circuit; and
a baseband signal processing circuit.

8. The composite filter device according to claim 1, wherein
the switch includes a first switch terminal electrically connected to the first bandpass filter, a second switch terminal electrically connected to the second bandpass filter, and a third switch terminal to which the impedance element is electrically connected;
the first switch terminal and the second switch terminal are electrically connected in the first state; and
the first switch terminal and the third switch terminal are electrically connected in the second state.

9. The composite filter device according to claim 1, wherein, in the second state, the switch is brought into an OFF state and a value of the impedance element is infinite.

10. The composite filter device according to claim 1, wherein an out-of-band attenuation of the first bandpass filter is larger than an out-of-band attenuation of the second bandpass filter.

11. The composite filter device according to claim 1, wherein
the first bandpass filter and the second bandpass filter are ladder filters; and
a total number of stages of a ladder in the first bandpass filter is smaller than a total number of stages of a ladder in the second bandpass filter.

12. The composite filter device according to claim 1, wherein an impedance matching element is electrically connected between the first bandpass filter and the second bandpass filter.

13. The composite filter device according to claim 1, wherein
the second bandpass filter is one of a plurality of second bandpass filters; and
the switch includes a plurality of second switch terminals respectively connected to the plurality of second bandpass filters.

14. The composite filter device according to claim 1, wherein
a pass band of one of the bandpass filters partially overlaps a pass band of another one of the bandpass filters.

15. The composite filter device according to claim 1, wherein all of the bandpass filters include a switch electrically connected between the one end and the another end, a first bandpass filter electrically connected between the one end and the switch, and a second bandpass filter electrically connected between the switch and the another end, and an impedance element electrically connected to the switch and having an impedance value larger than an input impedance value of the second bandpass filter.

16. The composite filter device according to claim 1, wherein the first bandpass filter and the second bandpass filter are both ladder filters respectively including series arm resonators and parallel arm resonators.

17. The composite filter device according to claim 1, wherein the at least one of the bandpass filters includes an additional switch electrically connected between the one end and the another end.

18. The composite filter device according to claim 1, further comprising an amplifier electrically connected to the second bandpass filter.

19. A composite filter device, comprising:
bandpass filters each including respective one ends and another ends; wherein
the one ends of the bandpass filters are electrically connected in common;
at least one of the bandpass filters includes a first bandpass filter electrically connected to the one end, a second bandpass filter electrically connected between the first bandpass filter and the another end, and a switch electrically connected between the first bandpass filter and the second bandpass filter; and
complex impedances of the first bandpass filter and the second bandpass filter have a same polarity in a pass band of another one of the bandpass filters different from the at least one of the bandpass filters when viewed from a same point in a circuit between the first bandpass filter and the second bandpass filter.

20. The composite filter device according to claim 19, wherein each of the bandpass filters includes a first bandpass filter electrically connected to the one end of the respective bandpass filter and a second bandpass filter electrically connected between the first bandpass filter and the another end of the respective bandpass filter; and in a state in which the first bandpass filter and the second bandpass filter of the respective bandpass filter are electrically connected, complex impedances of the first bandpass filter and the second bandpass filter have a same polarity when viewed from a same point in a circuit between the first bandpass filter and the second bandpass filter of the respective bandpass filter.

* * * * *